(12) United States Patent
Lee

(10) Patent No.: US 8,779,842 B2
(45) Date of Patent: Jul. 15, 2014

(54) VOLTAGE OUTPUT CIRCUIT AND APPARATUS FOR SELECTIVELY OUTPUTTING NEGATIVE VOLTAGE USING THE SAME

(71) Applicant: Yong Seop Lee, Seoul (KR)

(72) Inventor: Yong Seop Lee, Seoul (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 13/686,736

(22) Filed: Nov. 27, 2012

(65) Prior Publication Data

US 2014/0043091 A1 Feb. 13, 2014

(30) Foreign Application Priority Data

Aug. 7, 2012 (KR) .......................... 10-2012-0086359

(51) Int. Cl.
*H03K 3/01* (2006.01)
(52) U.S. Cl.
USPC .. 327/534; 327/535; 365/185.29; 365/185.33
(58) Field of Classification Search
CPC ...................................................... G05F 3/205
USPC ................. 327/534, 535; 365/185.29, 185.33
See application file for complete search history.

(56) References Cited

U.S. PATENT DOCUMENTS

| | | | | |
|---|---|---|---|---|
| 5,319,604 | A | * | 6/1994 | Imondi et al. ............. 365/185.18 |
| 5,701,272 | A | | 12/1997 | Brennan, Jr. |
| 6,233,177 | B1 | * | 5/2001 | Shokouhi et al. ........ 365/185.23 |
| 7,180,785 | B2 | * | 2/2007 | Kurihara ................... 365/185.23 |
| 7,495,960 | B2 | * | 2/2009 | Chih et al. ............... 365/185.18 |
| 2009/0261792 | A1 | | 10/2009 | Kim et al. |

FOREIGN PATENT DOCUMENTS

| | | |
|---|---|---|
| KR | 10-1999-0022544 | 3/1999 |
| KR | 20-2000-0019342 | 11/2000 |
| KR | 10-2009-0110687 | 10/2009 |
| KR | 10-2010-0076762 | 7/2010 |

OTHER PUBLICATIONS

Yong Gu Kang, Korean Patent Abstracts: 1020100076762, Abstract of 1020100076762, Jul. 6, 2010, 1 page, Korea.
Yeon Uk Kim, et al., Korean Patent Abstracts: 1020090110687, Abstract of 1020090110687, Oct. 22, 2009, 2 pages, Korea.
Huijo Yun, Translation of Abstract: KR 2000-0019342, Nov. 15, 2000, 1 page, Korea.

* cited by examiner

*Primary Examiner* — Kenneth B. Wells
(74) *Attorney, Agent, or Firm* — Murabito Hao & Barnes LLP; Andrew D. Fortney

(57) ABSTRACT

An apparatus selectively outputs one negative voltage from among a plurality of negative voltages. The apparatus includes a first switching unit configured to perform a switching operation and output a first voltage-on signal and a first voltage-off signal according to a selection signal and a first negative voltage signal, and a second switching unit configured to perform a switching operation and to output a second voltage-on signal and a second voltage-off signal according to the selection signal and a second negative voltage signal. The apparatus also includes a driving unit to select and output one negative voltage signal from among the first and second negative voltage signals according to the first negative voltage signal, the second negative voltage signal, the first voltage-on signal, the first voltage-off signal, the second voltage-on signal, and the second voltage-off signal.

18 Claims, 4 Drawing Sheets

VOLTAGE OUTPUT CIRCUIT AND APPARATUS FOR SELECTIVELY OUTPUTTING NEGATIVE VOLTAGE USING THE SAME

The present application claims priority under 35 U.S.C. §119 to Korean Patent Application No. 10-2012-0086359 (filed on Aug. 7, 2012), which is hereby incorporated by reference in its entirety.

FIELD OF THE INVENTION

The present invention relates to an apparatus that outputs a specific voltage from among a plurality of voltage signals, and an apparatus for selectively outputting one negative voltage from among a plurality of negative voltage signals.

BACKGROUND

In general, flash memory devices need an output apparatus for selecting a negative voltage for programming, erasing, or reading memory cells.

FIG. 1 illustrates a circuit diagram of an apparatus for selecting a negative voltage for flash memory devices in accordance with the related art.

As shown in FIG. 1, the apparatus for selecting a negative voltage receives a negative voltage signal VN1 and a selection signal SEL for allowing a desired voltage to be outputted to an output terminal OUT. The apparatus includes an inverter INV0, a first high-voltage PMOS transistor PM11, a second high-voltage PMOS transistor PM12, a first high-voltage NMOS transistor NM11, a second high-voltage NMOS transistor NM12, a third high-voltage NMOS transistor NM13, and a fourth high-voltage NMOS transistor NM14.

The inverter INV0 inverts the selection signal SEL to output an inverted selection signal SELb.

The first high-voltage PMOS transistor PM11 has a source and a bulk to which a supply voltage VDD is applied, a gate connected to a node of the inverted selection signal SELb, and a drain connected to a node of a voltage-off signal VEEOFF.

The second high-voltage PMOS transistor PM12 has a source and a bulk to which the supply voltage VDD is applied, a gate to which the selection signal SEL is applied, and a drain to which a voltage-on signal VEEON is applied.

The first high-voltage NMOS transistor NM11 has a source and a bulk to which a negative voltage signal VN1 is applied, a gate to which the voltage-on signal VEEON is applied, and a drain connected to the node of the voltage-off signal VEEOFF.

The second high-voltage NMOS transistor NM12 that has a source and a bulk to which the negative voltage signal VN1 is applied, a gate connected to the node of the voltage-off signal VEEOFF, and a drain connected to the node of the voltage-on signal VEEON.

The third high-voltage NMOS transistor NM13 has a source and a bulk to which the negative voltage signal VN1 is applied, a gate connected to the node of the voltage-on signal VEEON, and a drain connected to an output terminal OUT.

The fourth high-voltage NMOS transistor NM14 has a source to which a ground voltage VSS is applied, a gate connected to the node of the voltage-off signal VEEOFF, and a drain and a bulk connected to the output terminal OUT.

An operation of the apparatus having the above-described configuration is described as follows.

First, when the selection signal SEL is equal to the ground voltage VSS of a logic low, the ground voltage VSS is applied to the gate of the second high-voltage PMOS transistor PM12, and thus, the second high-voltage PMOS transistor PM12 is turned on to output the supply voltage VDD on the node of the voltage-on signal VEEON.

An inverted selection signal SELb has a supply voltage VDD level equal to a logic high, and is produced by the inverter INV0, which inverts the selection signal SEL. The supply voltage VDD, that corresponds to the inverted selection signal SELb, is supplied to the gate of the first high-voltage PMOS transistor PM11, thereby turning off the first high-voltage PMOS transistor PM11.

The supply voltage VDD on the node of the first voltage-on signal VEEON is inputted to the gate of the first high-voltage NMOS transistor NM11 to turn on the first high-voltage NMOS transistor NM11, and thus, the negative voltage signal VN1 is outputted on the node of the voltage-off signal VEEOFF.

The voltage-off signal VEEOFF on the node receiving the negative voltage signal VN1 is applied to the gate of the second high-voltage NMOS transistor NM12 to turn off the second high-voltage NMOS transistor NM12.

The voltage-off signal VEEOFF on the node receiving the negative voltage signal VN1 is applied to the gate of the fourth high-voltage NMOS transistor NM14 to turn off the fourth high-voltage NMOS transistor NM14.

Therefore, when the supply voltage VDD on the node of the voltage-on signal VEEON is inputted to the gate of the third high-voltage NMOS transistor NM13, the third high-voltage NMOS transistor NM13 is turned on, and the negative voltage signal VN1 is outputted on the output terminal OUT.

Next, when the selection signal SEL is equal to the supply voltage VDD of a logic high, the supply voltage VDD is applied to the gate of the second high-voltage PMOS transistor PM12 to turn off the second high-voltage PMOS transistor PM12.

The selection signal SEL is inputted to the inverter INV0, which inverts the selection signal SEL, and thus the node of the inverted selection signal SELb has a ground voltage VSS equal to a logic low.

The ground voltage VSS on the node of the inverted selection signal SELb is inputted to the gate of the first high-voltage PMOS transistor PM11 to turn on the first high-voltage PMOS transistor PM11, and thus, the supply voltage VDD is outputted on the node of the voltage-off VEEOFF.

The supply voltage VDD on the node of the voltage off VEEOFF is inputted to the gate of the second high-voltage NMOS transistor NM12 to turn on the second high-voltage NMOS transistor NM12, and thus, the negative voltage signal VN1 is outputted on the node of the voltage-on VEEON.

The negative voltage signal VN1 on the node of the voltage on VEEON is inputted to the gate of the first high-voltage NMOS transistor NM11 to turn off the first high-voltage NMOS transistor NM11.

The negative voltage signal VN1 on the node of the voltage on VEEON is inputted to the gate of the third high-voltage NMOS transistor NM13 to turn off the third high-voltage NMOS transistor NM13.

Therefore, when the supply voltage VDD on the node of the voltage-off signal VEEOFF is inputted to the gate of the fourth high-voltage NMOS transistor NM14, the fourth high-voltage NMOS transistor NM14 is turned on, and the ground voltage VSS is outputted on the output terminal OUT.

As described above, the apparatus for selecting a negative voltage outputs the negative voltage signal VN1 or the ground voltage VSS on the output terminal OUT according to the logic level of the selection signal SEL.

However, the apparatus for selecting a negative voltage is dedicated for only one negative voltage signal (VN1) and a ground voltage (VSS). Further, in all modes, only when the negative voltage signal is lower than or equal to 0 V corresponding to the ground voltage VSS, is the apparatus for selecting a negative voltage capable of operating.

On the other hand, in flash EEPROMs using a PMOS transistor as a memory element, a plurality of negative voltages may be used depending on modes (e.g., programming, erasure, or read), and a relatively lower voltage among the plurality of negative voltages may be changed depending on modes. For this reason, the related art apparatus for selecting a negative voltage cannot be applied to the flash EEPROMs. For example, when the levels of negative voltages differ depending on a mode such as programming, erasure, or read, the related art apparatus for selecting a negative voltage cannot select and output a desired negative voltage suitable for each mode.

SUMMARY

In view of the above, the present invention provides an apparatus for selectively outputting one negative voltage from among a plurality of negative voltages even when a relatively lower voltage among the plurality of negative voltages changes due to a change of modes (e.g., from read to programming).

Further, the present invention provides a voltage output circuit for outputting a specific voltage signal in a particular switching mode, which is capable of being employed in the apparatus for selectively outputting a negative voltage.

Embodiments relate to an apparatus for selectively outputting a negative voltage and a voltage output circuit for selectively outputting a negative voltage.

An apparatus for selectively outputting a negative voltage in accordance with one embodiment includes:
  a first switching unit configured to perform a switching operation to output a first voltage-on signal and a first voltage-off signal according to a selection signal and a first negative voltage signal;
  a second switching unit configured to perform a switching operation to output a second voltage-on signal and a second voltage-off signal according to the selection signal and a second negative voltage signal; and
  a driving unit configured to select and output a relatively lower negative voltage signal from among the first and second negative voltage signals according to the first negative voltage signal, the second negative voltage signal, the first voltage-on signal, the first voltage-off signal, the second voltage-on signal, and the second voltage-off signal.

In one embodiment, the first switching unit includes a plurality of first type MOS transistors and a plurality of second type MOS transistors, the second switching unit includes the plurality of first type MOS transistors and the plurality of second type MOS transistors, and the driving unit includes the plurality of second type MOS transistors.

In another embodiment, the first switching unit includes: a first MOS transistor having first and second terminals to which a supply voltage is applied, a third terminal receiving an inverted selection signal which has been inverted from the selection signal, and a fourth terminal connected to a first node to which the first voltage-off signal is outputted; a second MOS transistor having first and second terminals to which the supply voltage is applied, a third terminal to which the selection signal is applied, and a fourth terminal connected to a second node on which the first voltage-on signal is outputted; a third MOS transistor having first and second terminals to which the first negative voltage signal is applied, a third terminal connected to the second node, and a fourth terminal connected to the first node; and a fourth MOS transistor having first and second terminals to which the first negative voltage signal is applied, a third terminal connected to the first node, and a fourth terminal connected to the second node.

In a further embodiment, the second switching unit includes: a fifth MOS transistor having first and second terminals to which a supply voltage is applied, a third terminal receiving an inverted selection signal which has been inverted from the selection signal, and a fourth terminal connected to a third node to which the second voltage-on signal is outputted; a sixth MOS transistor having first and second terminals to which the supply voltage is applied, a third terminal to which the selection signal is applied, and a fourth terminal connected to a fourth node to which the second voltage-off signal is outputted; a seventh MOS transistor having first and second terminals to which the second negative voltage signal is applied, a third terminal connected to the fourth node, and a fourth terminal connected to the third node; and an eighth MOS transistor having first and second terminals to which the second negative voltage signal is applied, a third terminal connected to the third node, and a fourth terminal connected to the fourth node.

In a further embodiment, the first or second switching unit further includes an inverter configured to invert the selection signal and to output the inverted selection signal.

In a further embodiment, the driving unit includes: a ninth MOS transistor having a third terminal to which the first voltage-on signal is applied; a tenth MOS transistor having a third terminal to which the second voltage-off signal is applied; an eleventh MOS transistor having a third terminal to which the second voltage-on signal is applied; and a twelfth MOS transistor having a third terminal to which the first voltage-off signal is applied.

In a further embodiment, the ninth to twelfth MOS transistors each have second terminals that are connected to a fifth node and to which a relatively lower voltage signal among the first and second negative voltage signals is applied.

In a further embodiment, the driving unit includes: a thirteenth MOS transistor having a first terminal to which the first negative voltage signal is applied, a third terminal to which the second negative voltage signal is applied, and fourth and second terminals connected to the fifth node; and a fourteenth MOS transistor having a first terminal to which the second negative voltage signal is applied, a third terminal to which the first negative voltage signal is applied, and fourth and second terminals connected to the fifth node.

In a further embodiment, the ninth MOS transistor has a first terminal to which the first negative voltage signal is applied, and a fourth terminal connected to a first terminal of the tenth MOS transistor, the tenth MOS transistor has a fourth terminal connected to an output terminal, the eleventh MOS transistor has a first terminal connected to the output terminal, and a fourth terminal connected to a first terminal of the twelfth MOS transistor, and the twelfth MOS transistor has a fourth terminal to which the second negative voltage signal is applied.

Other embodiments of the invention relate to a voltage output circuit for selectively outputting a negative voltage that includes:
  a signal selection unit configured to perform a switching operation according to first and second negative voltage signals to output a relatively lower voltage signal among the first and second negative voltage signals to an intermediate node; and a signal output unit configured to perform a switching operation to output the first negative voltage signal or the second negative signal to an output terminal depending on the selection signal, the first negative voltage signal, the second negative voltage signal, a supply voltage, and a voltage signal of the intermediate node, in any one switching mode.

In one embodiment, the signal output unit includes a plurality of transistors, and wherein bulks of the transistors are each connected to the intermediate node, and gates of the transistors are connected to receive the first negative voltage signal, the second negative voltage signal, or the supply voltage.

DRAWINGS

The above-described objects and features of the embodiments of the present invention will become apparent from the following description of embodiments, provided in conjunction with the accompanying drawings, in which.

DESCRIPTION

The advantages and features of embodiments and methods of accomplishing these advantages and features will be clearly understood from the following description of the embodiments taken in conjunction with the accompanying drawings. However, embodiments are not limited to the described embodiments, as embodiments may be implemented in various forms. It should be noted that the present embodiments are provided to make a full disclosure and also to allow those skilled in the art to know the full range of the embodiments. Therefore, the embodiments are to be defined only by the scope of the appended claims.

In the following description, well-known terms and functions relating to the embodiments will be understood by those having ordinary skill in the art and, for the sake of clarity, will not be described in unnecessary detail or if they would obscure the invention. Further, the terminologies to be described below are defined in the context of the functions and design of the present invention and may differ from terms used in the relevant art to describe similar functions or structures. Therefore, the terms used to describe the present invention and its structures and functions should be interpreted based on the context and overall description of the present application.

Figure 1:
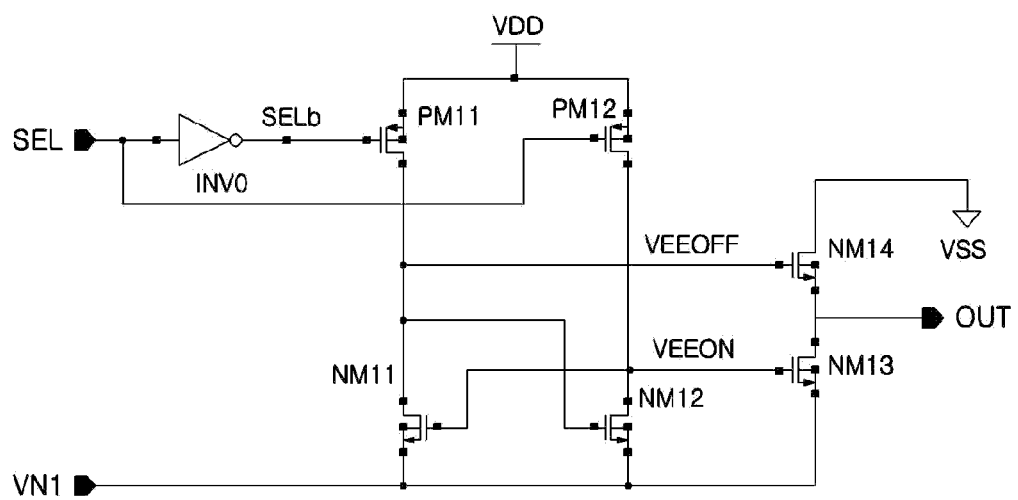
FIG. 1 illustrates a circuit diagram of an apparatus for selectively outputting a negative voltage for use in flash memory devices in accordance with the related art.
Figure 2:
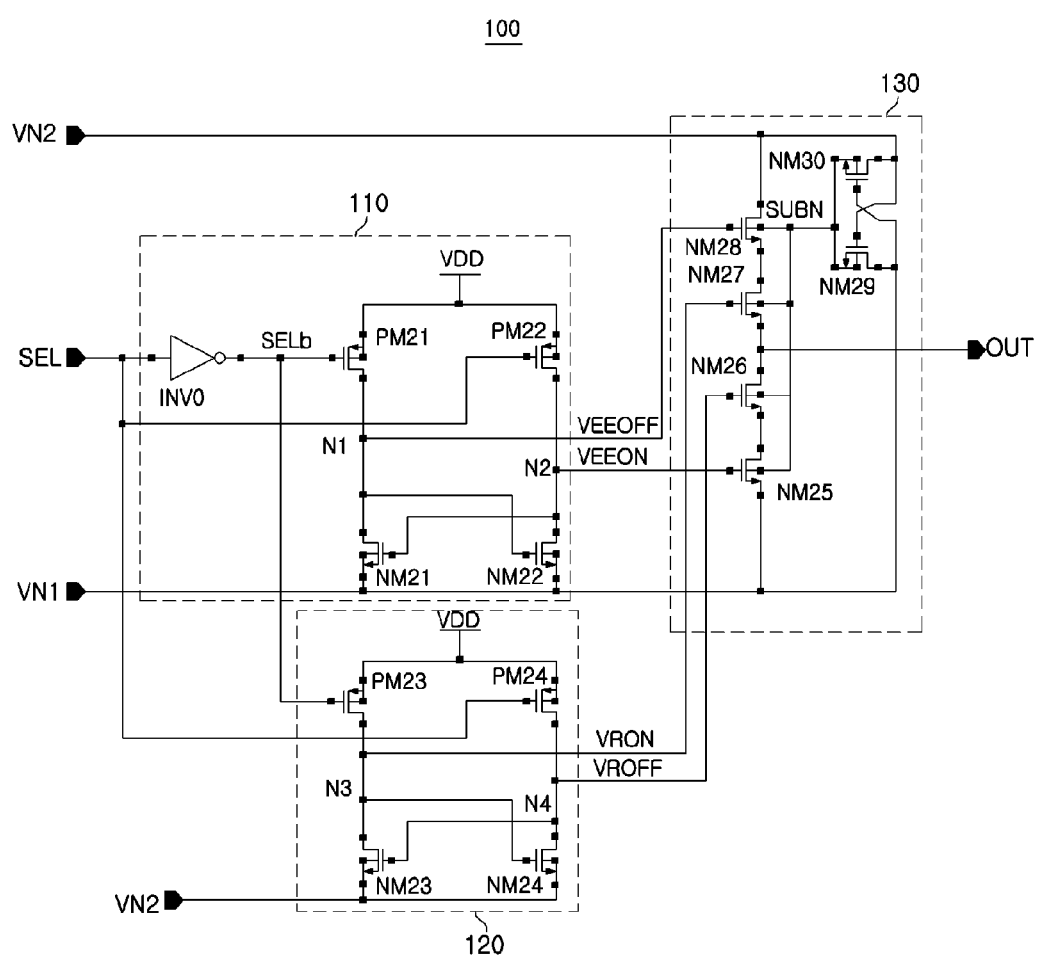
FIG. 2 illustrates a circuit diagram of an apparatus for selectively outputting a negative voltage in accordance with an embodiment of the present invention.

FIG. 2 illustrates a circuit diagram of an apparatus for selectively outputting a negative voltage in accordance with an embodiment of the present invention.

As illustrated in FIG. 2, an apparatus 100 for selectively outputting a negative voltage in accordance with an embodiment of the present invention includes a first switching unit 110, a second switching unit 120, and a driving unit 130.

The first switching unit 110 performs a switching operation to output a first voltage-on signal VEEON and a first voltage-off signal VEEOFF according to a selection signal SEL and a first negative voltage signal VN1.

The second switching unit 120 performs a switching operation to output a second voltage-on signal VRON and a second voltage-off signal VROFF according to the selection signal SEL and a second negative voltage signal VN2.

The driving unit 130 selects one of the first and second negative voltage signals VN1 and VN2 and outputs the selected negative voltage signal on an output terminal OUT, according to the first and second negative voltage signals VN1 and VN2, the first voltage-on signal VEEON, and the first voltage-off signal VEEOFF.

To this end, the first switching unit 110 may include a plurality of P-type MOS transistors PM21 and PM22 and a plurality of N-type MOS transistors NM21 and NM22, the second switching unit 120 includes a plurality of P-type MOS transistors PM23 and PM24 and a plurality of N-type MOS transistors NM23 and NM24, and the driving unit 130 includes a plurality of N-type MOS transistors NM25, NM26, NM27, NM28, NM29, and NM30.

The circuit configuration of the first switching unit 110 is described in more detail as follows.

A first MOS transistor (e.g., P-type MOS transistor PM21) has a source and a bulk to which a supply voltage VDD is applied, a gate receiving an inverted selection signal SELb (which an inverter INV0 generates by inverting a selection signal SEL) and a drain connected to a first node N1 from which the first voltage-off signal VEEOFF is outputted.

A second MOS transistor (e.g., P-type MOS transistor PM22) has a source and a bulk to which the supply voltage VDD is applied, a gate to which the selection signal SEL is applied, and a drain connected to a second node N2 from which the first voltage-on signal VEEON is outputted.

A third MOS transistor (e.g., N-type MOS transistor NM21) has a source and a bulk to which the first negative voltage signal VN1 is applied, a gate connected to the second node N2, and a drain connected to the first node N1.

A fourth MOS transistor (e.g., N-type MOS transistor NM22) has a source and a bulk to which the first negative voltage signal VN1 is applied, a gate connected to the first node N1, and a drain connected to the second node N2.

The circuit configuration of the second switching unit 120 is described in more detail as follows.

A fifth MOS transistor (e.g., P-type MOS transistor PM23) has a source and a bulk to which the supply voltage VDD is applied, a gate that receives the inverted selection signal SELb (which the inverter INV0 generates by inverting the selection signal SEL) and a drain connected to a third node N3 from which the second voltage-on signal VRON is outputted.

A sixth MOS transistor, P-type MOS transistor PM24, has a source and a bulk to which the supply voltage VDD is applied, a gate to which the selection signal SEL is applied, and a drain connected to a fourth node N4 from which the second voltage-off signal VROFF is outputted.

A seventh MOS transistor, N-type MOS transistor NM23, has a source and a bulk to which the second negative voltage signal VN2 is applied, a gate connected to the fourth node N4, and a drain connected to the third node N3.

An eighth MOS transistor, N-type MOS transistor NM24, has a source and a bulk to which the second negative voltage signal VN2 is applied, a gate connected to the third node N3, and a drain connected to the fourth node N4.

For operations of the first and second switching units 110 and 120, both the selection signal SEL and the inverted selection signal SELb (which the inverter INV0 generates by inverting the selection signal SEL) are required. To this end, one of the first and second switching units 110 and 120 generally includes the inverter INV0 that inverts the selection signal SEL to output the inverted selection signal SELb.

Figure 3:
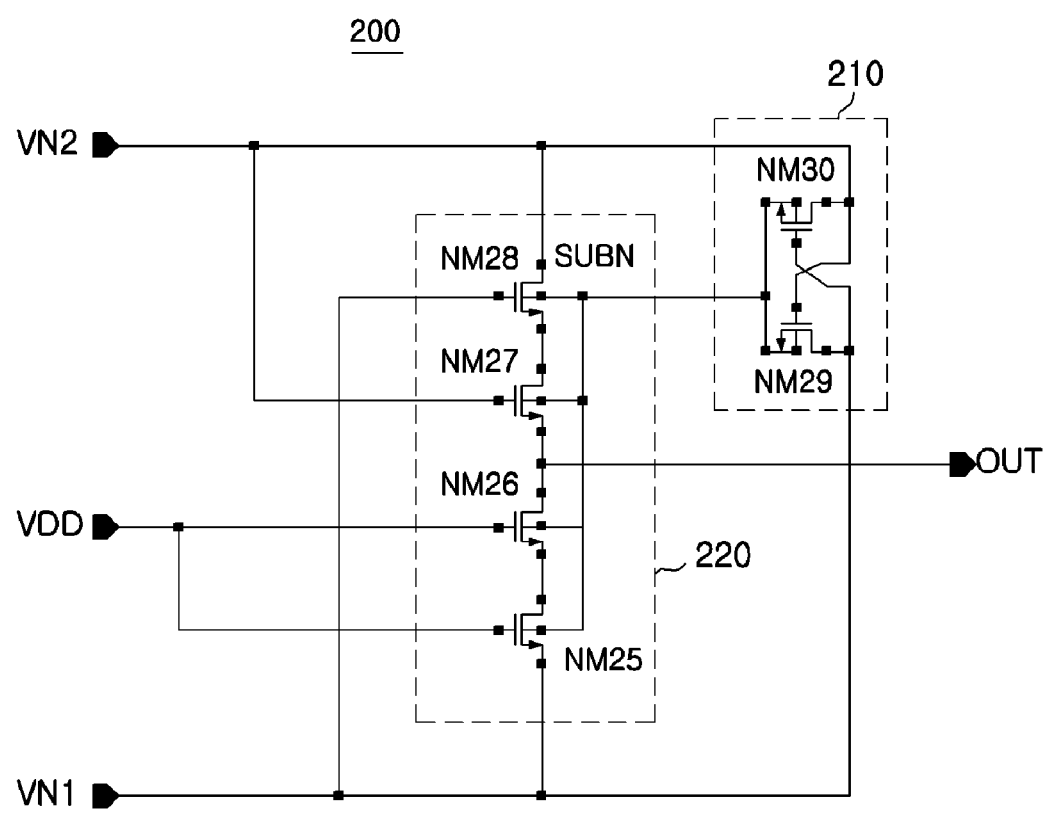
FIGS. 3 and 4 illustrate circuit diagrams of an apparatus for selectively outputting a negative voltage in accordance with another embodiment of the present invention.

Alternatively, the first and second switching units 110 and 120 may receive the inverted selection signal SELb from an external source (e.g., an inverted signal generator), in a similar manner to way the selection signal SEL is generated. An embodiment of FIG. 3 illustrates a case in which the first switching unit 110 includes the inverter INV0. Alternatively, the second switching unit 120 may receive the selection signal SEL, and either (1) include the inverter INV0 or (2) receive the inverted selection signal SELb.

The circuit configuration of the driving unit 130 is described in more detail as follows.

A ninth MOS transistor (e.g., N-type MOS transistor NM25) has a gate to which the first voltage-on signal VEEON is applied, a bulk connected to a fifth node SUBN to which the relatively lower voltage signal among the first and second negative voltage signals VN1 and VN2 is applied, a source to which the first negative voltage signal VN1 is applied, and a drain connected to a source of the N-type tenth MOS transistor NM26.

A tenth MOS transistor (e.g., N-type MOS transistor NM26) has a gate to which the second voltage-off signal VROFF is applied, a bulk connected to the fifth node SUBN to which a relatively low voltage signal among the first and second negative voltage signals VN1 and VN2 is applied, and a drain connected to the output terminal OUT.

An eleventh MOS transistor (e.g., N-type MOS transistor NM27) has a gate to which the second voltage-on signal VRON is applied, a bulk connected to the fifth node SUBN to which a relatively low voltage signal among the first and second negative voltage signals VN1 and VN2 is applied, a source connected to the output terminal OUT, and a drain connected to a source of the N-type twelfth MOS transistor NM28.

A twelfth MOS transistor (e.g., N-type MOS transistor NM28) has a gate to which the first voltage-off signal VEEOFF is applied, a bulk connected to the fifth node SUBN to which a relatively lower voltage signal among the first and second negative voltage signals VN1 and VN2 is applied, and a drain to which the second negative voltage signal VN2 may be applied.

A thirteenth MOS transistor (e.g., N-type MOS transistor NM29) has a source to which the first negative voltage signal VN1 is applied, a gate to which the second negative voltage signal VN2 is applied, and a drain and a bulk that are connected to the fifth node SUBN.

A fourteenth MOS transistor (e.g., N-type MOS transistor NM30) has a source to which the second negative voltage signal VN2 is applied, a gate to which the first negative voltage signal VN1 is applied, and a drain and a bulk that are connected to the fifth node SUBN.

An operation of the apparatus 100 in accordance with an embodiment of the present invention is described below.

First, when the first negative voltage signal VN1 is lower than the second negative voltage signal VN2, the thirteenth MOS transistor NM29 receives the first negative voltage signal VN1 through its source and is turned on by the selection signal (SEL), and the fourteenth MOS transistor NM30 receiving the second negative voltage signal VN2 through its source and is turned off by the inverted selection signal (SELb). When the first negative voltage signal VN1 is lower than the second negative voltage signal VN2, VN1 is applied to the fifth node SUBN.

Alternatively, when the first negative voltage signal VN1 is higher than the second negative voltage signal VN2, the fourteenth MOS transistor NM30 receives the second negative voltage signal VN2 through its source and is turned on by the inverted selection signal (SELb), and the second negative voltage signal VN2 is applied to the fifth node SUBN. Also, the thirteenth MOS transistor NM29 receives the first negative voltage signal VN1 through its source and is turned off by the inverted selection signal.

By the operations of the thirteenth and fourteenth MOS transistors NM29 and NM30 as set forth above, the lower voltage among the first and second negative voltage signals VN1 and VN2 is applied to the fifth node SUBN.

The selection signal SEL determines which voltage signal (VN1 or VN 2) is supplied to the output (OUT). In one operation mode, the selection signal SEL is equal to a ground voltage VSS and has a logic low, the ground voltage VSS is inputted to the gate of the second MOS transistor PM22 to turn on the second MOS transistor PM22, and the supply voltage VDD is then outputted to the second node N2.

The inverter INV0 inverts the selection signal SEL to output a voltage equal to the supply voltage VDD having a logic high as the inverted selection signal SELb, and the supply voltage VDD corresponding to the inverted selection signal SELb is inputted to the gate of the first MOS transistor PM21 to turn off the first MOS transistor PM21.

The supply voltage VDD on the second node N2 is applied to the gate of the third MOS transistor NM21 to turn on the third MOS transistor NM21, and the first negative voltage signal VN1 is then outputted to the first node N1.

The first negative voltage signal VN1 on the first node N1 is applied to the gate of the fourth MOS transistor NM22 to turn off the fourth MOS transistor NM22.

When the selection signal SEL having a logic low is inputted to the gate of the sixth MOS transistor PM24, the sixth MOS transistor PM24 is turned on, and thus, the supply voltage VDD is outputted on the fourth node N4.

When the inverted selection signal SELb of a logic high is inputted to the gate of the fifth MOS transistor PM23, the fifth MOS transistor PM23 is then turned off.

When the supply voltage VDD on the fourth node N4 is inputted to the gate of the seventh MOS transistor NM23, the seventh MOS transistor NM23 is turned on, and consequently, the second negative voltage signal VN2 is then outputted on the third node N3.

The second negative voltage signal VN2 on the third node N3 is applied to the gate of the eighth MOS transistor NM24 to turn off the eighth MOS transistor NM24.

Therefore, the ninth MOS transistor NM25 receives the supply voltage VDD (corresponding to the first voltage-on signal VEEON) on the second node N2 at its gate and is thereby turned on, and the tenth MOS transistor NM26 receives the supply voltage VDD (corresponding to the second voltage-off signal VROFF) on the fourth node N4 at its gate and is thereby turned on.

The twelfth MOS transistor NM28 receives the first negative voltage signal VN1 (corresponding to the first voltage-off signal VEEOFF) on the first node N1 at its gate and is thereby turned off, and the eleventh MOS transistor NM27 receives the second negative voltage signal VN2 (corresponding to the second voltage-on signal VRON) on the third node N3 at its gate and is thereby turned off.

When the selection signal SEL is equal to the ground voltage VSS, having a logic low, the operations of the ninth to twelfth MOS transistors NM25 to NM28 are as set forth above, and the first negative voltage signal VN1 is outputted to the output terminal OUT.

In another operation mode, the selection signal SEL may be a voltage equal to the supply voltage VDD and have a logic high. In this mode, the supply voltage VDD is inputted to the gate of the second MOS transistor PM22 to turn off the second MOS transistor PM22.

The inverter INV0 inverts the selection signal SEL to output the ground voltage VSS having a logic low as the inverted selection signal SELb, and the ground voltage VSS corresponding to the inverted selection signal SELb is inputted to the gate of the first MOS transistor PM21 to turn off the first MOS transistor PM21, and the supply voltage VDD is outputted on the first node N1.

The supply voltage VDD on the first node N1 is inputted to the gate of the fourth MOS transistor NM22 to turn on the fourth MOS transistor NM22, and the first negative voltage signal VN1 is outputted on the second node N2.

The first negative voltage signal VN1 on the second node N2 is applied to the gate of the third MOS transistor NM21 to turn off the third MOS transistor NM21.

Further, when the selection signal SEL having a logic high is inputted to the gate of the sixth MOS transistor PM24, the sixth MOS transistor PM24 is turned off.

When the inverted selection signal SELb having a logic low is inputted to the gate of the fifth MOS transistor PM23, the fifth MOS transistor PM23 is turned on, and thus, the supply voltage VDD is outputted on the third node N3.

The supply voltage VDD on the third node N3 is inputted to the gate of the eighth MOS transistor NM24 to turn on the eighth MOS transistor NM24, and thus, the second negative voltage signal VN2 is outputted on the fourth node N4.

The second negative voltage signal VN2 on the fourth node N4 is applied to the gate of the seventh MOS transistor NM23 to turn off the seventh MOS transistor NM23.

Therefore, the twelfth MOS transistor NM28 receives the supply voltage VDD (corresponding to the first voltage-off signal VEEOFF) on the first node N2 at its gate and is thereby turned on, and the eleventh MOS transistor NM27 receives the supply voltage VDD (corresponding to the second voltage-on signal VRON) on the third node N3 at its gate and is thereby turned on.

The ninth MOS transistor NM25 receives the first negative voltage signal VN1 (corresponding to the first voltage-on signal VEEON) on the second node N2 at its gate and is thereby turned off, and the tenth MOS transistor NM26 receives the second negative voltage signal VN2 (corresponding to the second voltage-off signal VROFF) on the fourth node N4 at its gate and is thereby turned off.

When the SEL is equal to the supply voltage VDD having a logic high, the operations of the ninth to twelfth MOS transistors NM25 to NM28 are as set forth above, and the second negative voltage signal VN2 is outputted to the output terminal OUT.

Alternatively, the driving unit 130 may be separately used as a voltage output circuit for outputting a specific voltage signal, e.g., a negative voltage, in any one switching mode. Examples on this are illustrated in FIGS. 3 and 4.

Figure 4:
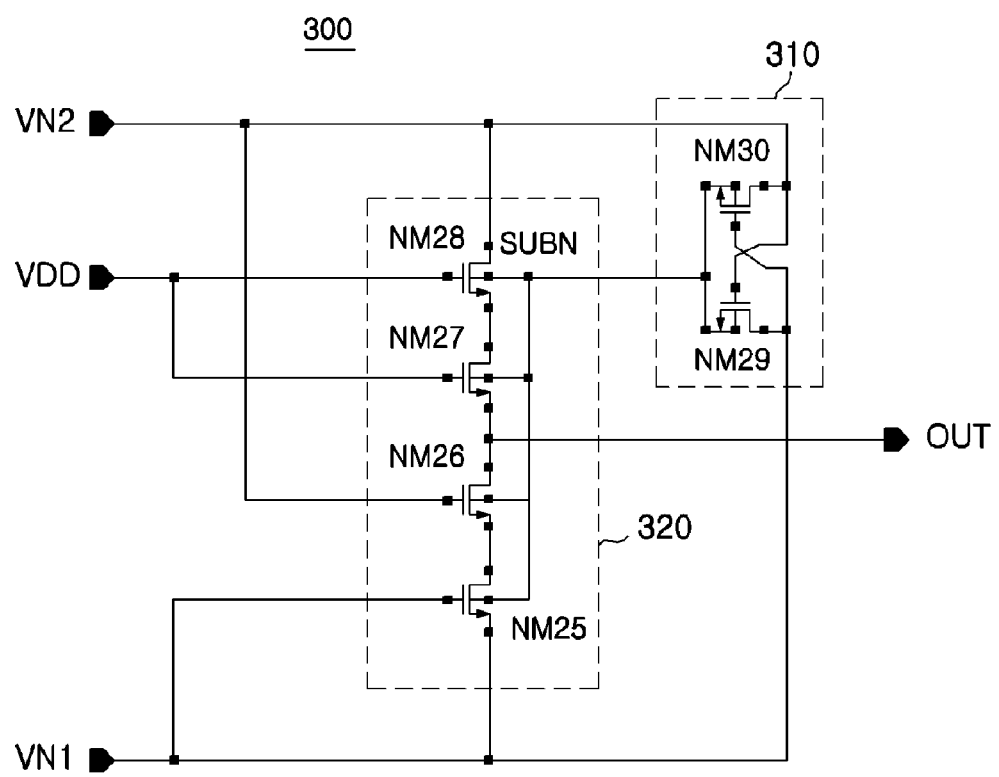

FIGS. 3 and 4 illustrate circuit diagrams of a voltage output circuit for selectively outputting a negative voltage in accordance with other embodiments of the present invention.

In the embodiment illustrated in FIG. 3, a voltage output circuit 200 for selectively outputting a negative voltage in accordance with an embodiment of the present invention includes a signal selection unit 210 and a signal output unit 220.

The signal selection unit 210 performs a switching operation according to first and second negative voltage signals VN1 and VN2, and outputs a relatively lower negative voltage signal among the first and second negative voltage signals VN1 and VN2 to an intermediate node SUBN.

The signal output unit 220 performs a switching operation to output the first negative voltage signal VN1 to an output terminal OUT. The embodiment of FIG. 3 illustrates the operation of the signal output unit 220 and signal selection unit 210 in an operation in which VN1 is lower than VN2. However, the signal output unit 220 and signal selection unit 210 may operate in the context of an apparatus for selectively outputting a negative voltage as shown in FIG. 2. Thus, the negative voltage signal selected by the signal output unit 220 depends on the first and second negative voltage signals VN1 and VN2, a supply voltage VDD, and the voltage signal on the intermediate node SUBN, in any one switching mode.

The signal output unit 220 includes a plurality of transistors (e.g., NMOS transistors) NM25, NM26, NM27, and NM28. In signal output unit 220, a bulk is connected to the intermediate node SUBN and to each of the plurality of transistors NM25-NM28. The embodiment of FIG. 3 illustrates the operation of the signal output unit 220 and signal selection unit 210 in a mode in which VN1 is lower than VN2. In such a case, the supply voltage VDD is applied to each of gates of the transistors NM25 and NM26, the second negative voltage signal VN2 is applied to a gate of the transistor NM27, and the first negative voltage signal VN1 is applied to a gate of the transistor NM28.

As described above, the configuration and operation of the voltage output circuit of FIG. 3 may be understood in the context of the operation of the output apparatus of FIG. 2 when the selection signal SEL is equal to the ground voltage VSS having a logic low, and thus, the first negative voltage signal VN1 is outputted to the output terminal OUT.

In the embodiment illustrated in FIG. 4, a voltage output circuit 300 for selectively outputting a negative voltage in accordance with another embodiment of the present invention includes a signal selection unit 310 and a signal output unit 320.

Like signal selection unit 210, the signal selection unit 310 performs a switching operation according to first and second negative voltage signals VN1 and VN2, and outputs a relatively lower negative voltage signal among the first and second negative voltage signals VN1 and VN2 to an intermediate node SUBN.

The signal output unit 320 performs a switching operation to output the second negative voltage signal VN2 to the output terminal OUT. The embodiment of FIG. 4 illustrates the operation of the signal output unit 320 and signal selection unit 310 in an operation in which VN2 is lower than VN1. However, the signal output unit 320 and signal selection unit 310 may operate in the context of an apparatus for selectively outputting a negative voltage as shown in FIG. 2. Thus, the negative voltage signal selected by the signal output unit 320 depends on the first and second negative voltage signals VN1 and VN2, a supply voltage VDD, and the voltage signal of the intermediate node SUBN, of any one switching mode.

The signal output unit 320 includes a plurality of transistors (e.g., NMOS transistors) NM25, NM26, NM27, and NM28. In the signal output unit 320, a bulk is connected to the intermediate node SUBN and to each of the plurality of transistors NM25-NM28. The embodiment of FIG. 4 illustrates the operation of the signal output unit 320 and signal selection unit 310 in an operation in which VN2 is lower than VN1. In such a case, the first negative voltage signal VN1 is applied to a gate of the transistor NM25, the second negative voltage signal VN2 is applied to a gate of the transistor NM26, and the supply voltage VDD is applied to each of gates of the transistors NM27 and NM28.

As described above, the configuration and operation of the voltage output circuit of FIG. 4 may be understood in the context of the operation of the output apparatus of FIG. 2 when the selection signal SEL is equal to the ground voltage VDD having a logic high, and thus, the first negative voltage signal VN2 is outputted to the output terminal OUT.

As described above with reference to FIGS. 3 and 4, the signal output unit 220 may output the first negative voltage signal VN1 on the output terminal OUT, and the signal output unit 320 may output the second negative voltage signal VN2 on the output terminal OUT. For example, when the first and second negative voltage signals VN1 and VN2 are interchanged and inputted to the signal output unit 220, the signal output unit 220 may output the second negative voltage VN2 on the output terminal OUT, and the signal output unit 320 may output the first negative voltage VN1 on the output terminal OUT. In this present application, the first and second negative voltage signals VN1 and VN2 are merely for differentiating two voltage signals having different voltage levels, and for example, the voltage level of the first negative voltage signal VN1 may be relatively higher than that of the second negative voltage signal VN2, or the voltage level of the first negative voltage signal VN1 may be relatively lower than that of the second negative voltage signal VN2. Therefore, the signal output unit 220 to output the first negative voltage signal VN1 on the output terminal OUT denotes that the signal output unit 220 outputs a specific negative voltage signal among a plurality of negative voltage signals. That is, the present invention may be construed as including an embodiment in which the signal output unit 220 outputs the second negative voltage signal VN2 on the output terminal OUT.

According to the embodiments of the present invention, even when a relatively lower voltage among a plurality of negative voltages is changed depending on different operational modes, any one voltage may be selected and outputted. Accordingly, even when the levels of negative voltages differ depending on a mode such as programming, erasure, or read of a flash EEPROM, the present invention can select and output a desired negative voltage suitable for each mode. It should be understood from the present disclosure that the present invention may include one or more additional units, allowing an apparatus for selectively outputting a negative voltage according to the present invention to select from 3 or more negative voltage signals.

While the invention has been described with respect to certain embodiments, the present invention is not limited thereto. It will be understood by those skilled in the art that various changes and modifications may be made without departing from the scope of the invention.

What is claimed is:

1. An apparatus for selectively outputting a negative voltage, the apparatus comprising:
   a first switching unit configured to perform a switching operation to output a first voltage-on signal and a first voltage-off signal according to a selection signal and a first negative voltage signal;
   a second switching unit configured to perform a switching operation to output a second voltage-on signal and a second voltage-off signal according to the selection signal and a second negative voltage signal; and
   a driving unit configured to select and output a relatively lower negative voltage signal from among the first and second negative voltage signals.

2. The apparatus of claim 1, wherein the first switching unit comprises a first plurality of first type MOS transistors and a first plurality of second type MOS transistors,
   the second switching unit comprises a second plurality of first type MOS transistors and a second plurality of second type MOS transistors, and
   the driving unit comprises a third plurality of second type MOS transistors.

3. The apparatus of claim 1, wherein the first switching unit comprises:
   a first MOS transistor having first and second terminals to which a supply voltage is applied, a third terminal receiving an inverted selection signal, and a fourth terminal connected to a first node to which the first voltage-off signal is outputted;
   a second MOS transistor having first and second terminals to which the supply voltage is applied, a third terminal to which the selection signal is applied, and a fourth terminal connected to a second node on which the first voltage-on signal is outputted;
   a third MOS transistor having first and second terminals to which the first negative voltage signal is applied, a third terminal connected to the second node, and a fourth terminal connected to the first node; and
   a fourth MOS transistor having first and second terminals to which the first negative voltage signal is applied, a third terminal connected to the first node, and a fourth terminal connected to the second node.

4. The apparatus of claim 3, wherein the second switching unit comprises:
   a fifth MOS transistor having first and second terminals to which a supply voltage is applied, a third terminal receiving an inverted selection signal which has been inverted from the selection signal, and a fourth terminal connected to a third node on which the second voltage-on signal is outputted;
   a sixth MOS transistor having first and second terminals to which the supply voltage is applied, a third terminal to which the selection signal is applied, and a fourth terminal connected to a fourth node to which the second voltage-off signal is outputted;
   a seventh MOS transistor having first and second terminals to which the second negative voltage signal is applied, a third terminal connected to the fourth node, and a fourth terminal connected to the third node; and
   an eighth MOS transistor having first and second terminals to which the second negative voltage signal is applied, a third terminal connected to the third node, and a fourth terminal connected to the fourth node.

5. The apparatus of claim 3, wherein the first switching unit further comprises an inverter configured to invert the selection signal and to output the inverted selection signal.

6. The apparatus of claim 1, further comprising an inverter configured to invert the selection signal and to output the inverted selection signal.

7. The apparatus of claim 4, wherein the driving unit comprises:
   a ninth MOS transistor having a third terminal to which the first voltage-on signal is applied;
   a tenth MOS transistor having a third terminal to which the second voltage-off signal is applied;
   an eleventh MOS transistor having a third terminal to which the second voltage-on signal is applied; and
   a twelfth MOS transistor having a third terminal to which the first voltage-off signal is applied.

8. The apparatus of claim 7, wherein the ninth to twelfth MOS transistors each have a second terminal that is connected to a fifth node and to which the relatively lower voltage signal among the first and second negative voltage signals is applied.

9. The apparatus of claim 8, wherein the driving unit further comprises:

a thirteenth MOS transistor having a first terminal to which the first negative voltage signal is applied, a third terminal to which the second negative voltage signal is applied, and fourth and second terminals connected to the fifth node; and a fourteenth MOS transistor having a first terminal to which the second negative voltage signal is applied, a third terminal to which the first negative voltage signal is applied, and fourth and second terminals connected to the fifth node.

10. The apparatus of claim 8, wherein the ninth MOS transistor has a first terminal to which the first negative voltage signal is applied, and a fourth terminal connected to a first terminal of the tenth MOS transistor, the tenth MOS transistor has a fourth terminal connected to an output terminal, the eleventh MOS transistor has a first terminal connected to the output terminal, and a fourth terminal connected to a first terminal of the twelfth MOS transistor, and the twelfth MOS transistor has a fourth terminal to which the second negative voltage signal is applied.

11. The apparatus of claim 5, wherein the inverter inverts a logic low signal to a logic high signal.

12. The apparatus of claim 6, wherein the inverter inverts a logic low signal to a logic high signal.

13. The apparatus of claim 5, wherein the inverter inverts a logic high signal to a logic low signal.

14. The apparatus of claim 6, wherein the inverter inverts a logic high signal to a logic low signal.

15. The apparatus of claim 2, wherein the first switching unit comprises:

a first P-type MOS transistor having first and second terminals to which a supply voltage is applied, a third terminal receiving an inverted selection signal, and a fourth terminal connected to a first node to which the first voltage-off signal is outputted;

a second P-type MOS transistor having first and second terminals to which the supply voltage is applied, a third terminal to which the selection signal is applied, and a fourth terminal connected to a second node on which the first voltage-on signal is outputted;

a first N-type MOS transistor having first and second terminals to which the first negative voltage signal is applied, a third terminal connected to the second node, and a fourth terminal connected to the first node; and a second N-type MOS transistor having first and second terminals to which the first negative voltage signal is applied, a third terminal connected to the first node, and a fourth terminal connected to the second node.

16. The apparatus of claim 2, wherein the second switching unit comprises:

a first P-type MOS transistor having first and second terminals to which a supply voltage is applied, a third terminal receiving an inverted selection signal which has been inverted from the selection signal, and a fourth terminal connected to a third node on which the second voltage-on signal is outputted;

a second P-type MOS transistor having first and second terminals to which the supply voltage is applied, a third terminal to which the selection signal is applied, and a fourth terminal connected to a fourth node to which the second voltage-off signal is outputted;

a first N-type MOS transistor having first and second terminals to which the second negative voltage signal is applied, a third terminal connected to the fourth node, and a fourth terminal connected to the third node; and a second N-type MOS transistor having first and second terminals to which the second negative voltage signal is applied, a third terminal connected to the third node, and a fourth terminal connected to the fourth node.

17. The apparatus of claim 2, wherein the driving unit comprises:

a first N-type MOS transistor having a third terminal to which the first voltage-on signal is applied;

a second N-type MOS transistor having a third terminal to which the second voltage-off signal is applied;

a third N-type MOS transistor having a third terminal to which the second voltage-on signal is applied; and a fourth N-type MOS transistor having a third terminal to which the first voltage-off signal is applied.

18. The apparatus of claim 17, wherein the driving unit further comprises a fifth N-type MOS transistor having a first terminal to which the first negative voltage signal is applied, a third terminal to which the second negative voltage signal is applied, and fourth and second terminals connected to the fifth node; and a sixth N-type MOS transistor having a first terminal to which the second negative voltage signal is applied, a third terminal to which the first negative voltage signal is applied, and fourth and second terminals connected to the fifth node.

* * * * *